United States Patent [19]

Naem

[11] Patent Number: 5,780,349
[45] Date of Patent: Jul. 14, 1998

[54] SELF-ALIGNED MOSFET GATE/SOURCE/DRAIN SALICIDE FORMATION

[75] Inventor: Abdalla Aly Naem, Sunnyvale, Calif.

[73] Assignee: National Semiconductor Corporation, Santa Clara, Calif.

[21] Appl. No.: 803,259

[22] Filed: Feb. 20, 1997

[51] Int. Cl.$^6$ .................... H01L 21/336; H01L 21/3205
[52] U.S. Cl. .................... 438/305; 438/592; 438/593
[58] Field of Search .................... 438/299–303, 438/305, 592, 593

[56] References Cited

U.S. PATENT DOCUMENTS

| | | | |
|---|---|---|---|
| 5,006,911 | 4/1991 | Sivan | 357/23.11 |
| 5,162,246 | 11/1992 | Ozturk et al. | 437/41 |
| 5,198,378 | 3/1993 | Rodder et al. | 437/41 |
| 5,213,990 | 5/1993 | Rodder | 437/40 |
| 5,314,832 | 5/1994 | Deleonibus | 438/297 |
| 5,376,578 | 12/1994 | Hsu et al. | 438/300 |
| 5,413,957 | 5/1995 | Byun | 438/297 |
| 5,422,289 | 6/1995 | Pierce | 437/32 |
| 5,496,750 | 3/1996 | Moslehi | 437/41 |
| 5,539,229 | 7/1996 | Noble, Jr. et al. | 257/301 |

OTHER PUBLICATIONS

C.T. Liu, et al., "MOSFET's with One–Mask Sealed Diffusion–Junctions for ULSI Applications", IEEE Electron Device Letters, vol. 16, No. 8, Aug. 1995.
T.M. Liu, et al., "An Ultra High Speed ECL–Bipolar CMOS Technology with Silicon Fillet Self–aligned Contacts", IEEE Symposium on VLSI Technology Digest of Technical Papers, pp. 30–31, 1992.
T.M. Liu, et al., "A Half–micron Super Self–aligned BiCMOS Technology for High Speed Applications", IEEE, pp. 2.2.1–2.2.4, 1992 month unknown.
T.M. Liu, et al., "The Control of Polysilicon/Silicon Interface Processed by Rapid Thermal Anneal", IEEE, pp. 263–266, 1991 month unknown.
Tzu–Yin Chiu, et al., "Non–overlapping Super Self–Aligned BiCMOS with 87ps Low Power ECL", IEEE, pp. 752–755, 1988 month unknown.

Primary Examiner—John Niebling
Assistant Examiner—Michael S. Lebentritt
Attorney, Agent, or Firm—Limbach & Limbach L.L.P.

[57] ABSTRACT

MOSFET device structure includes planarized trench isolation field oxide regions formed in a silicon substrate, a layer of gate oxide formed on the substrate to electrically insulate the polysilicon gate from the substrate, oxide sidewall spacers formed on sidewalls of the polysilicon gate and the gate oxide, and LDD N–regions formed in the substrate adjacent to the field oxide regions and beneath the sidewall spacers to define a channel region in the substrate beneath the polysilicon gate. A layer of polysilicon is deposited on the above-defined structure and a chemical mechanical polishing step is performed to form raised source/drain polysilicon regions that are self-aligned to the LDD N– regions. N–type dopant is then implanted into the polysilicon gate and into the raised source/drain polysilicon regions. A first rapid thermal processing (RTP) step is then performed to activate the N–type dopant and to diffuse N–type dopant from the raised source/drain polysilicon regions into the underlying LDD N– regions to form N+ junctions within the LDD N– regions. A layer of cobalt is then deposited on the polysilicon gate and on the raised source/drain polysilicon regions in ultra high vacuum. The cobalt layer is then implanted with heavy ions to mix the cobalt and silicon at the cobalt/poly interface. A thin titanium nitride film is then formed on the cobalt layer to protect the cobalt film from nitrogen diffusion during RTP. A second RTP step is then performed to form cobalt salicide on the raised source/drain polysilicon regions and on the polysilicon gate.

7 Claims, 4 Drawing Sheets

SELF-ALIGNED MOSFET GATE/SOURCE/DRAIN SALICIDE FORMATION

BACKGROUND OF THE INVENTION

1. Field of the Invention

The present invention relates to fabrication techniques for integrated circuit elements and, in particular, to a process flow for fabricating a MOSFET that utilizes self-aligned gate and source/drain salicide films.

2. Discussion of the Related Art

FIG. 1 shows a conventional MOSFET transistor 10 fabricated in an active device region of a semiconductor wafer substrate, the active device region being defined by field oxide regions. In fabricating the MOSFET 10, a layer of polysilicon is formed on a layer of thin oxide that is formed on the substrate active device region. The polysilicon layer is then masked and both the exposed polysilicon and the underlying thin oxide are etched to define a polysilicon gate region 12 separated from the substrate by thin gate oxide 14. A self-aligned implant of N–type dopant then forms lightly doped diffusion (LDD) source/drain regions in the substrate as a first phase in forming the substrate N+source/drain regions of the MOSFET. After the formation of oxide sidewall spacers (SWS) 15 on the sidewalls of the polysilicon gate 12 and of the gate oxide 14, a second N+ implant is performed to set the conductivity of the gate region 12 to a desired level and to complete the N+ source/drain regions 16. Titanium is then deposited on the exposed upper surfaces of the N+ source/drain regions 16 and the polysilicon gate region 12 and annealed, thereby causing the titanium to react with the underlying N+ silicon of the substrate source/drain regions 16 and the doped polysilicon gate 12 to form titanium salicide 18 on these surfaces. A layer of dielectric material 20, typically silicon oxide, is then formed, contact openings are etched in the dielectric 20, and a metallization layer 22 is formed to provide contacts to the salicide 18 on the source/drain regions 16 and on the polysilicon gate 12.

The above-described MOSFET fabrication technique suffers from potential problems in the formation of source/drain regions 16. First, selective growth of the salicide needed for good contacts with the metallization layer requires a reaction between the titanium and underlying silicon. Therefore, the titanium must be formed on the N+ source/drain regions 16, which must be wide enough to accommodate the photolithographic limitations of the contact opening; this results in a wider device. Also, since silicon is consumed in this process, the junction depth of the N+ source/drain regions 16 is difficult to control and dopant depletion can occur in these regions. Furthermore, formation of the deep, heavily-doped N+ junction for the source/drain regions 16 can result in dopant diffusion under the gate region, thereby reducing the effective channel length of the MOSFET, i.e., the so-called "short channel effect."

SUMMARY OF THE INVENTION

The present invention provides a method of fabricating a MOSFET device structure in a silicon substrate. The MOSFET device structure includes planarized trench isolation field oxide regions formed in the substrate, a layer of gate oxide formed on the substrate to electrically insulate the polysilicon gate from the substrate, oxide sidewall spacers formed on sidewalls of the polysilicon gate and gate oxide, and LDD N– regions formed on the substrate adjacent the field oxide regions and beneath the sidewall spacers to define a channel region in the substrate beneath the polysilicon gate. In accordance with the method of the invention, a layer of polysilicon is deposited on the abovedefined structure and a chemical mechanical polishing step is performed to define raised source/drain polysilicon regions that are self-aligned to the LDD N– regions. N–type dopant is then implanted into the polysilicon gate and into the raised source/drain polysilicon regions. A first rapid thermal processing step is then performed to activate the N–type dopant and to diffuse N–type dopant from the raised source/drain polysilicon regions into the underlying LDD N– regions to form shallow N+ junctions within the LDD N– regions. A cleaning step is performed and a layer of cobalt is then deposited on the polysilicon gate and on the raised source/drain polysilicon regions. The cobalt layer is then implanted with heavy ions to mix the cobalt and silicon at the interface of the cobalt layer and the underlying polysilicon. A titanium nitride capping film is then formed on the cobalt layer to protect the film from nitrogen diffusion during RTP, which results in producing a highly uniform salicide layer due to the absence of foreign materials in the cobalt film. The TiN film also results in reducing the RTP thermal budget. The first salicidation RTP step is performed at low temperature (about 450 degrees C.) to allow the cobalt to be the diffusing species into the underlying silicon. By doing this, the lateral growth of the cobalt salicide is eliminated. The TiN film and unreacted cobalt is then removed. A second RTP step is then performed to form cobalt salicide on the raised source/drain polysilicon regions and on the polysilicon gate. A layer of dielectric material is formed on the resulting structure. Contact openings are then formed and a metallization layer is provided to provide electrical contact with the cobalt salicide on the raised source/drain polysilicon regions and on the polysilicon gate.

The above-described process flow provides a significantly bigger salicide formation process window as far as silicon consumption, RTP temperature, lateral growth of salicide, and salicide thickness are concerned. Additionally, the gate/source/drain contact depth differential typically associated with the prior art is now eliminated. The highly selective cobalt salicide completely eliminates salicide attack during contact etch. Furthermore, the self-aligned salicide structure resulting from the above-defined flow eliminates the sidewall spacer thinning that typically occurs during the salicide exclusion oxide removal and other surface cleaning steps in a conventional process flow. This self-aligned salicide module also eliminates the shorts between the source/drain junction and the device well, at the bird's beak of the conventional LOCOS isolation. In the conventional structure, the salicide would shunt these regions if they are exposed during an oxide exclusion overetch. Furthermore, because cobalt is the diffusing species into the underlying silicon, lateral growth of the cobalt salicide is eliminated.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

A process flow for fabricating a MOSFET device in accordance with the present invention will now be described in conjunction with the partial cross-sectional drawings provided in FIGS. 2A–2L. While no specific process parameters are provided, those skilled in the art will appreciate that the concepts of the invention are applicable regardless of these parameters, which will differ depending upon the specific integrated circuit structure under manufacture. Those skilled in the art will also appreciate that, while the following discussion is directed to the fabrication of N-channel devices, the concepts of the invention apply to all MOSFET technologies.

Figure 1:
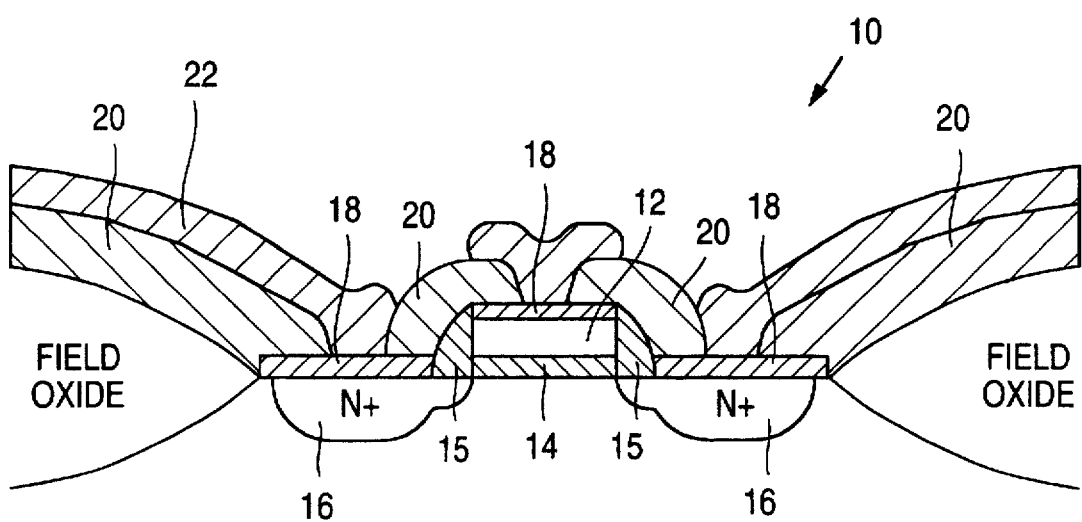
FIG. 1 is a partial cross-sectional drawing illustrating a conventional MOSFET design.
Figure 2A:
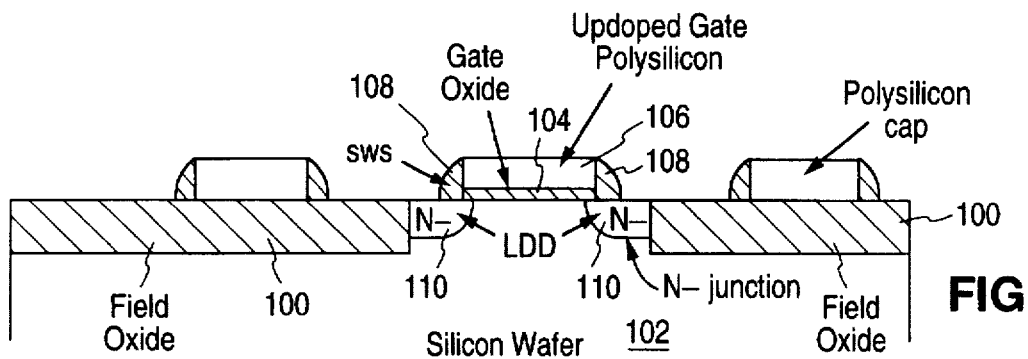
FIGS. 2A–2L are partial cross-sectional drawings illustrating a sequence of steps for fabricating a raised source/drain MOSFET in accordance with the concepts of the present invention.

The initial fabrication sequence proceeds in a conventional manner through the formation of the trench isolation structure shown in FIG. 2A. As shown in FIG. 2A, conventional planarized trench isolation field oxide regions 100 are formed in a silicon wafer 102. A layer of thin gate oxide 104 is formed on the substrate 102 to electrically insulate an undoped polysilicon gate 106 from the substrate 102. Oxide sidewall spacers (SWS) 108 are formed on the sidewalls of the polysilicon gate 106 and the gate oxide 104. Low density diffusion (LDD) N– regions 110 are formed in the substrate 102 adjacent field oxide regions 100 and beneath the oxide sidewall spacers 108 to define a channel region in the substrate 102 beneath the polysilicon gate 106.

As further shown in FIG. 2A, the first layer of polysilicon can also be utilized in the formation of polysilicon capacitors and resistors on the field oxide regions 100.

Figure 2B:
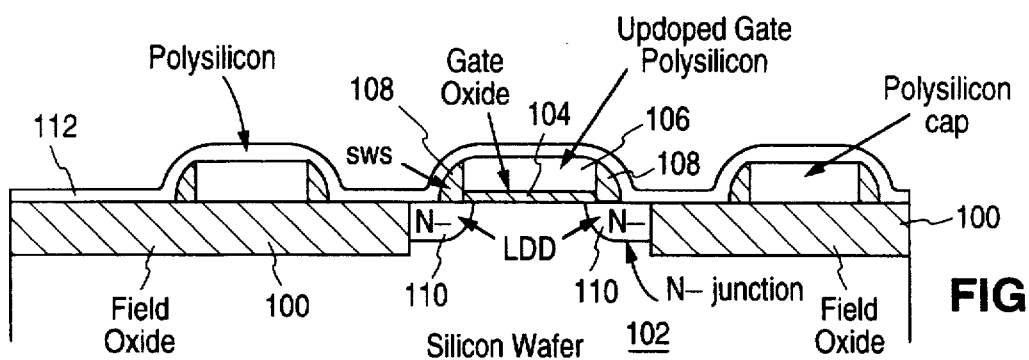
Figure 2C:
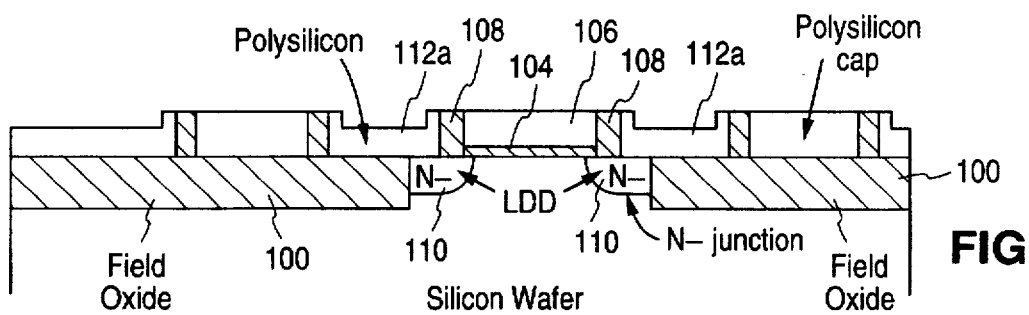

As shown in FIG. 2B, a layer of polysilicon film 112 is then deposited over the FIG. 2A structure and a chemical mechanical polishing (CMP) step is performed to self-align the polysilicon film 112a to the N– source/drain regions 110, resulting in the structure shown in FIG. 2C. While FIG. 2C shows self-aligned poly regions 112a that are not fully planarized with, for example, the upper surface of the poly gate 106, those skilled in the art will appreciate that the original thickness of the poly layer 112 can be chosen so that the CMP step results in a fully planarized structure.

Figure 2D:
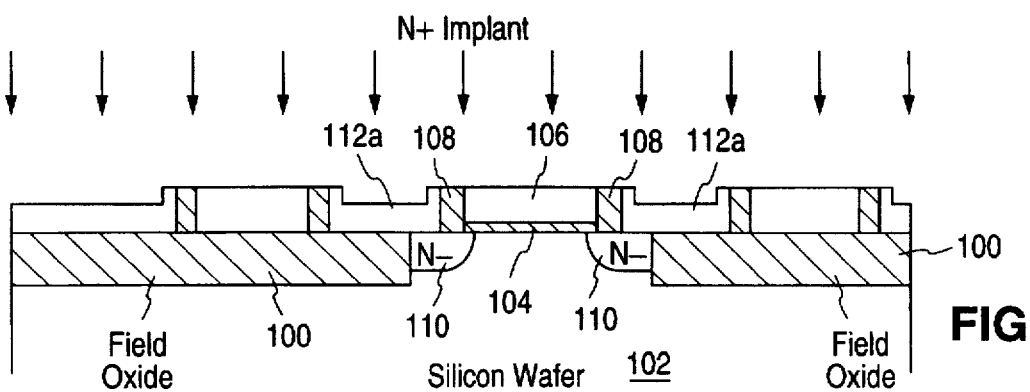

As shown in FIG. 2D, an N+ dopant, preferably arsenic, is then implanted into the gate polysilicon 106 and the raised source/drain polysilicon regions 112a to dope these regions of exposed polysilicon to a desired conductivity level.

Figure 2E:
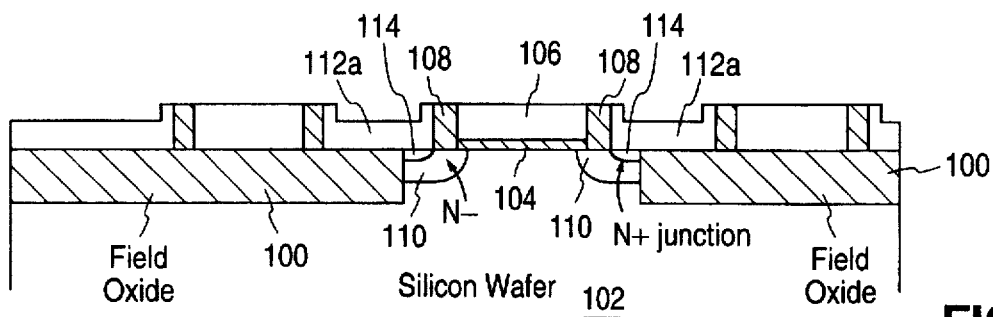

A rapid thermal processing (RTP) step is then performed to activate the N+ implant and to diffuse the arsenic to form a shallow N+ junction 114 within the N– LDD source/drain regions 110, resulting in the structure shown in FIG. 2E.

Figure 2F:
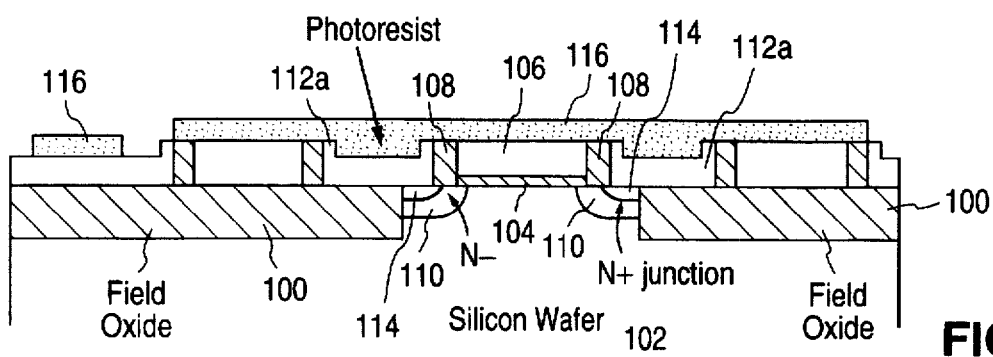

Next, as shown in FIG. 2F, a photoresist mask 116 is defined over the FIG. 2E structure to pattern the thin film resistor (TFR) and at the same time protect the source/drain polysilicon regions 112a. The unwanted polysilicon is then etched and the photoresist mask 116 is removed, resulting in the structure shown in FIG. 2G.

Figure 2G:
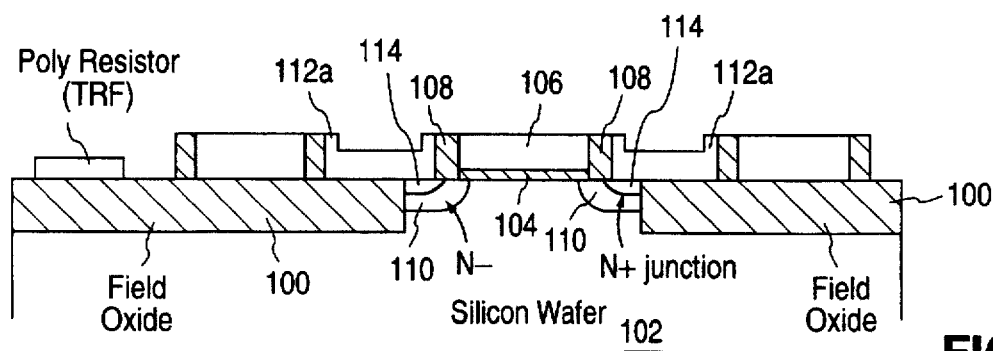
Figure 2H:
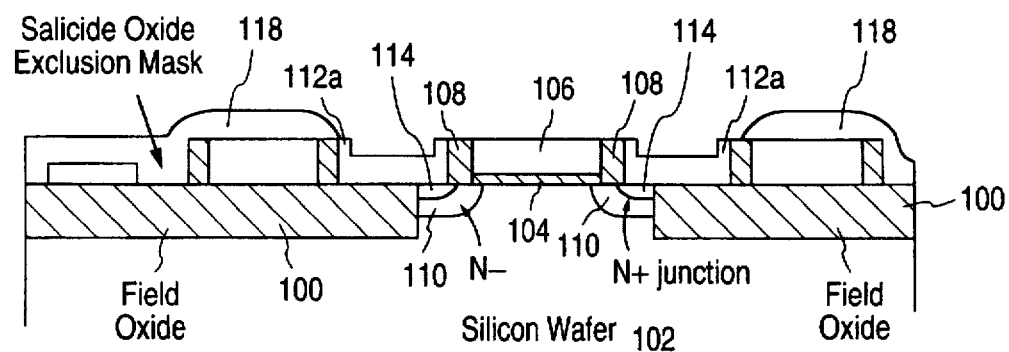

Next, a salicide oxide exclusion mask layer is formed and etched to protect the FIG. 2G structure with the exception of the photoresist source/drain regions 112a and the polysilicon gate 106, as shown in FIG. 2H.

Figure 2I:
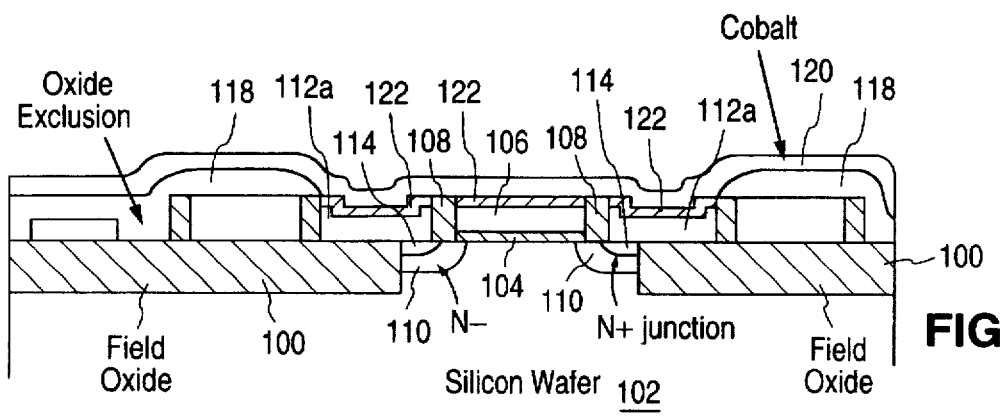
Figure 2J:
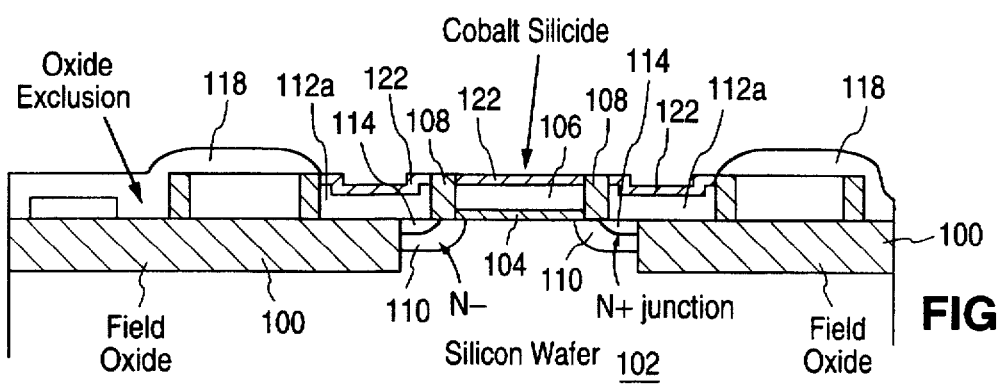

Next, as shown in FIG. 2I, a wet cleaning step is performed and a cobalt film is deposited over the FIG. 2H structure in ultra high vacuum, preferably $10^{-8}$–$10^{-9}$ mTorr, to prevent contamination during sputter deposition of the cobalt. The cobalt film is then implanted with heavy ions, e.g. gallium or arsenic, at high energy to mix the Co/Si interface in order to break the native oxide or any contaminant film at the Co/Si interface. A thin TiN capping film is then deposited to protect the cobalt film from nitrogen diffusion during RTP, thereby producing a highly uniform salicide layer due to the absence of foreign material in the cobalt film. The TiN film will also result in reducing the RTP thermal budget. A rapid thermal processing (RTP) step is performed to form salicide 120 on the raised source/drain polysilicon regions 112a and the polysilicon gate region 106. The first salicidation step is performed at low temperature, preferably about 450 degrees C., to allow the cobalt to be the diffussing species into the underlying silicon. By doing this, the lateral growth of cobalt salicide is eliminated. The TiN film and the unreacted cobalt film is then removed using a wet selective etch, resulting in the structure shown in FIG. 2J.

Figure 2K:
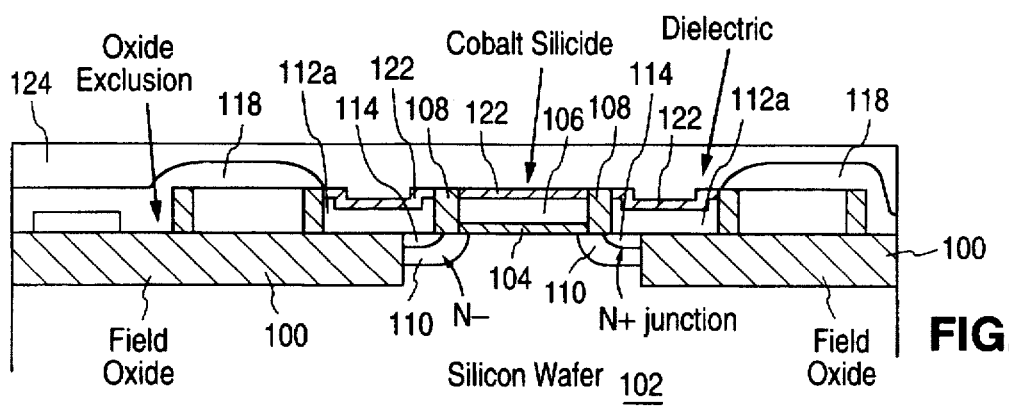

After removal of the unwanted cobalt, a second RTP step is performed to obtain the stable phase salicide with low resistivity. A dielectric layer 124 is then deposited and a chemical mechanical polishing (CMP) step is performed to planarize the structure, as shown in FIG. 2K.

Figure 2L:
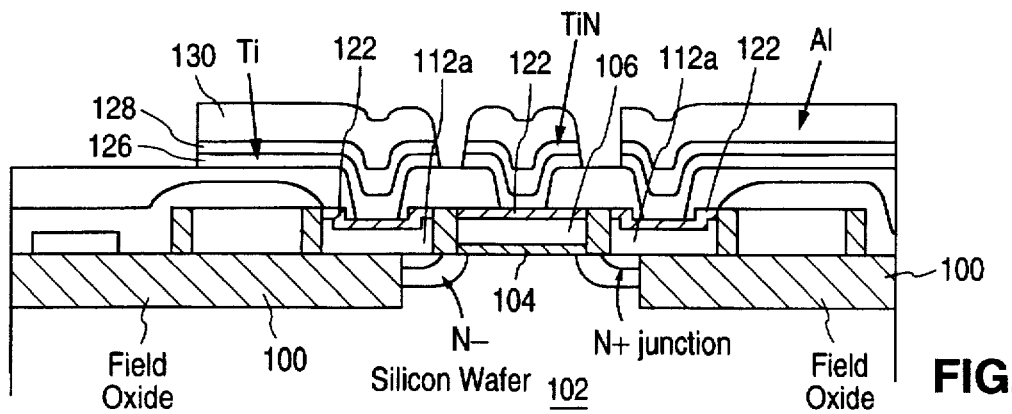

Finally, as shown in FIG. 2L, contact holes are opened in the dielectric layer 124 and a metallization structure is deposited to form contacts with the cobalt salicide 122 formed on the raised source/drain regions 112a and on the polysilicon gate 106. In the embodiment of the invention illustrated in FIG. 2L, the contact metallization includes a first layer of titanium 126, a second layer of titanium nitride 128 and a final layer of aluminum 130.

It should be understood that various alternatives to the embodiments of the invention described herein may be employed in practicing the invention. It is intended that the following claims define the scope of the invention and methods and structures within the scope of these claims and their equivalents be covered thereby.

What is claimed is:

1. A method of fabricating a MOSFET device structure in a silicon substrate, wherein the MOSFET device structure includes planarized trench isolation field oxide regions formed in the substrate, a layer of gate oxide formed on the substrate to electrically insulate a polysilicon gate from the substrate, oxide sidewall spacers formed on sidewalls of the polysilicon gate and the gate oxide, LDD N– regions formed in the substrate adjacent the field oxide regions and beneath the sidewall spacers to define a channel region in the substrate beneath the polysilicon gate, the method comprising the steps of:

depositing a layer of polysilicon on the above-defined structure;

performing a chemical mechanical polishing (CMP) step to form raised source/drain polysilicon regions that are self-aligned to the LDD N– regions;

implanting N-type dopant into the polysilicon gate and into the raised source/drain polysilicon regions;

performing a first rapid thermal processing (RTP) step to activate the N-type dopant implant and to diffuse N-type dopant from the raised source/drain polysilicon regions into the underlying LDD N– regions;

depositing a layer of cobalt on the polysilicon gate and on the raised source/drain polysilicon regions;

implanting heavy ions into the cobalt layer to mix the cobalt and silicon at the interface of the cobalt layer and the underlying polysilicon;

depositing a TiN film on the cobalt layer;

performing a second RTP step to form cobalt salicide on the raised source/drain polysilicon regions and on the polysilicon gate;

removing unreacted cobalt;

forming a layer of dielectric material on the structure resulting from the above-recited steps;

forming contact openings in the dielectric layer to expose the cobalt salicide on the raised source/drain polysilicon regions and on the polysilicon gate;

forming a conductive contact layer in the contact opening, and in electrical contact with the cobalt salicide on the raised source/drain polysilicon regions and on the polysilicon gate.

2. A method as in claim 1 and wherein the step of depositing a cobalt layer is performed in ultra high vacuum.

3. A method as in claim 1 and wherein the step of depositing a cobalt layer is peformed at $10^{-8}$–$10^{-9}$ mTorr.

4. A method as in claim 1 and wherein said heavy ions are selected from gallium and arsenic.

5. A method as in claim 1 and wherein the step of performing the second RTP step is performed at low temperature such that the cobalt becomes the diffusing species into the underlying silicon, whereby lateral growth of cobalt salicide is eliminated.

6. A method as in claim 5 and wherein the low temperature is about 450 degrees C.

7. A method as in claim 1 and wherein the TiN film protects the underlying cobalt film from contamination.

* * * * *